United States Patent
Kallman et al.

(10) Patent No.: US 10,201,098 B2
(45) Date of Patent: Feb. 5, 2019

(54) SELECTIVE PARTITIONING OF VIA STRUCTURES IN PRINTED CIRCUIT BOARDS

(71) Applicant: Telefonaktiebolaget LM Ericsson (publ), Stockholm (SE)

(72) Inventors: Stig Kallman, Kumla (SE); Tomas Bergsten, Rangedala (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 0 days.

(21) Appl. No.: 16/019,452

(22) Filed: Jun. 26, 2018

(65) Prior Publication Data

US 2018/0310418 A1    Oct. 25, 2018

Related U.S. Application Data

(62) Division of application No. 14/387,928, filed as application No. PCT/SE2014/050619 on May 20, 2014, now Pat. No. 10,034,391.

(Continued)

(51) Int. Cl.
*H05K 3/42* (2006.01)
*H05K 1/09* (2006.01)
(Continued)

(52) U.S. Cl.
CPC ............ *H05K 3/429* (2013.01); *C25D 5/02* (2013.01); *C25D 5/022* (2013.01); *H05K 1/092* (2013.01);
(Continued)

(58) Field of Classification Search
CPC .................. H05K 3/429; H05K 1/092; H05K 2201/09645; H05K 2203/0713;
(Continued)

(56) References Cited

U.S. PATENT DOCUMENTS

| 6,426,470 B1* | 7/2002 | Farquhar | H05K 3/429 |
| | | | 174/262 |
| 6,541,712 B1* | 4/2003 | Gately | H05K 1/115 |
| | | | 174/258 |

(Continued)

FOREIGN PATENT DOCUMENTS

| CN | 102781177 A | 11/2012 |
| JP | H04206694 A | 7/1992 |

(Continued)

OTHER PUBLICATIONS

Communication under Rule 71(3) EPC for Application No. 14729483. 9, dated Aug. 5, 2016, 21 pages.

(Continued)

*Primary Examiner* — Sherman Ng
(74) *Attorney, Agent, or Firm* — Nicholson De Vos Webster & Elliott, LLP

(57) ABSTRACT

The embodiments herein relate to an apparatus and medium for selective partitioning of a via in a printed circuit board as to produce an electrically isolating portion between two electrically conducting portions in said via. The apparatus and medium implement a step of prior to drilling the hole for the via, laminating plating resist layers to the printed circuit board at a distance from each other corresponding to a desired length of the electrically isolated portion of the via. After drilling, copper is added to selected portions of the interior of the via in two different processing steps followed by a step of removing undesired copper as to produce the electrically isolating portion.

20 Claims, 5 Drawing Sheets

Related U.S. Application Data

(60) Provisional application No. 61/831,400, filed on Jun. 5, 2013.

(51) Int. Cl.
*C25D 5/02* (2006.01)
*H05K 1/11* (2006.01)

(52) U.S. Cl.
CPC ...... *H05K 1/115* (2013.01); *H05K 2201/0187* (2013.01); *H05K 2201/09645* (2013.01); *H05K 2203/0713* (2013.01)

(58) Field of Classification Search
CPC ........... H05K 2201/0187; H05K 1/115; C25D 5/022; C25D 5/02
USPC ................................................. 174/262, 266
See application file for complete search history.

(56) References Cited

U.S. PATENT DOCUMENTS

| | | | |
|---|---|---|---|
| 8,222,537 | B2 | 7/2012 | Dudnikov, Jr. et al. |
| 8,667,675 | B2 | 3/2014 | Dudnikov, Jr. |
| 2003/0121699 | A1* | 7/2003 | Happoya ................ H05K 1/115 174/262 |
| 2003/0199390 | A1 | 10/2003 | Chang |
| 2004/0118605 | A1 | 6/2004 | Van Der Laan |
| 2006/0199390 | A1 | 9/2006 | Dudnikov et al. |
| 2008/0296057 | A1* | 12/2008 | Dudnikov, Jr. ...... H05K 1/0257 174/266 |
| 2008/0301934 | A1* | 12/2008 | Dudnikov, Jr. ...... H05K 1/0257 29/837 |
| 2009/0288874 | A1* | 11/2009 | Dudnikov, Jr. ...... H05K 1/0257 174/266 |
| 2012/0234587 | A1 | 9/2012 | Nakamura et al. |
| 2014/0001150 | A1 | 1/2014 | Lecesse |
| 2014/0251663 | A1* | 9/2014 | Iketani ................... H05K 1/115 174/255 |
| 2014/0262455 | A1 | 9/2014 | Iketani et al. |
| 2015/0208514 | A1* | 7/2015 | Thomas ................. H05K 3/429 205/125 |
| 2016/0278207 | A1* | 9/2016 | Pen ........................ H05K 1/115 |

FOREIGN PATENT DOCUMENTS

| | | |
|---|---|---|
| JP | 2003204157 A | 7/2003 |
| JP | 2003229666 A | 8/2003 |
| JP | 2008532326 A | 8/2008 |
| RU | 2324307 C2 | 5/2008 |
| WO | 2014145387 A2 | 9/2014 |
| WO | 2014145387 A3 | 1/2015 |

OTHER PUBLICATIONS

Decision to Grant a Patent for Japan Application No. 2015544037, dated Jun. 17, 2016, 6 pages.
Decision to Grant from foreign counterpart Russian Patent Application No. 2015155524, dated May 22, 2017, 7 pages. (English translation only available).
Extended European Search Report and Opinion for Application No. 16191313.2, dated Jan. 5, 2017, 6 pages.
Final Office Action from U.S. Appl. No. 14/387,928, dated Dec. 5, 2017, 16 pages.
Final Office Action from U.S. Appl. No. 14/387,928, dated Mar. 2, 2017, 12 pages.
First Office Action and Search report from foreign counterpart China Patent Application No. 201480003061.1, dated Feb. 4, 2017, 19 pages.
International Preliminary Report of Application No. PCT/SE2014/050619, dated Dec. 8, 2015, 8 pages.
International Search Report and Written Opinion for Application No. PCT/SE2014/050619, dated Aug. 21, 2014, 12 pages.
Non-Final Office Action from U.S. Appl. No. 14/387,928, dated May 19, 2017, 19 pages.
Non-Final Office Action from U.S. Appl. No. 14/387,928, dated Oct. 6, 2016, 22 pages.
Notice of Allowance from foreign counterpart Korean Patent Application No. 20157015978, dated Mar. 16, 2017, 3 pages.
Notice of Allowance from U.S. Appl. No. 14/387,928, dated Mar. 26, 2018, 7 pages.
Office Action from Mexican Application No. MX/a/2015/016517, dated Oct. 12, 2016, 5 pages.
Requirement for Restriction/Election from U.S. Appl. No. 14/387,928, dated May 25, 2016, 10 pages.

\* cited by examiner

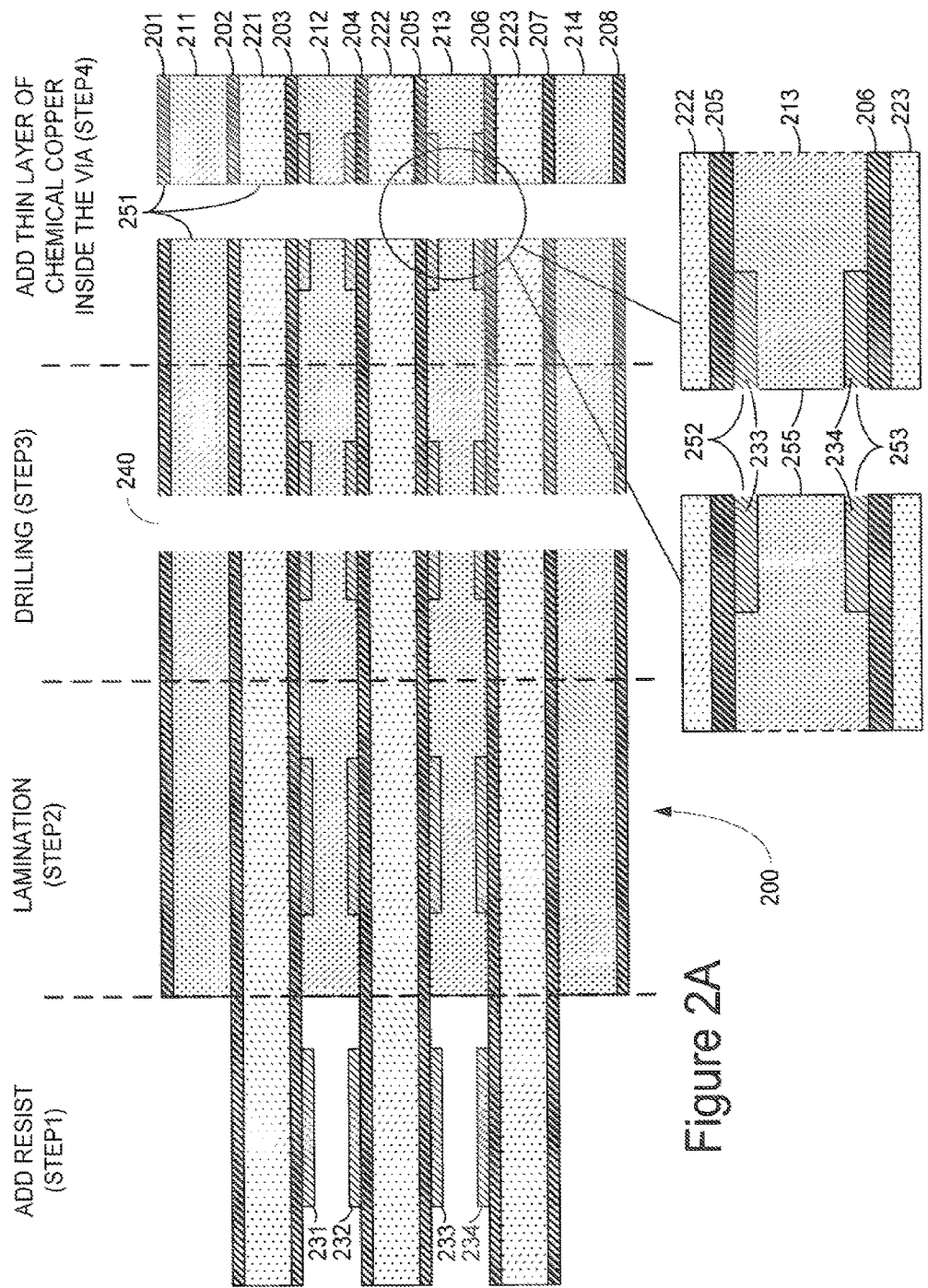

SELECTIVE PARTITIONING OF VIA STRUCTURES IN PRINTED CIRCUIT BOARDS

CROSS-REFERENCE TO RELATED APPLICATIONS

This application is a divisional of U.S. application Ser. No. 14/387,928, which is the national stage of International Application No. PCT/SE2014/050619, filed May 20, 2014, which claims the benefit of U.S. Provisional Application No. 61/831,400, filed Jun. 5, 2013, which are hereby incorporated by reference.

TECHNICAL FIELD

Embodiments herein relates to a method for selective partitioning of via structures in printed circuit boards.

BACKGROUND ART

To allow signals to travel between different conductive layers in a multilayer printed circuit board PCB, plated via structures are used. Often the plating is done to the whole inner surface of the via, but the plating can also be done selectively at certain parts within the same via to allow for more efficient use of conductive layers in the PCB.

FIGS. 1A and 1B illustrate two examples of selective partitioning of via structures known from prior art.

FIG. 1A illustrates a multilayer PCB 100 with a plurality of conductive layers 101-106 sandwiched with a plurality of dielectric layers 111-113,121-122. FIG. 1A also illustrates a via structure 140 in the PCB 100. The via 140 comprises two plated electrically conductive portions 141 and 142 and between the two plated portions is an electrically isolating portion 145.

FIG. 1B illustrates another multilayer PCB 150 with a plurality of conductive layers 151-156 sandwiched with a plurality of dielectric layers 161-163,171-172 and a via structure 190. The via 190 also comprises two plated conductive portions 191 and 192 but between the two plated portions is an electrically isolating portion 195 that is larger than in FIG. 1A.

The electrically isolated portions 145 and 195 are produced by using plating resist layers 143 and 193 of different thickness.

A disadvantage with using a relatively thin plating resist layer 143 as in FIG. 1A is that the distance between the two plated portions 141 and 142 may be insufficient in order to achieve a valid isolation distance, especially for high voltage electronics.

A disadvantage with a thick plating resist layer 193 as in FIG. 1B is that the manufacturing process is more work intensive as the PCB need a number of additional preparation steps such as milling open portions in the dielectric layers before the thick plating resist layer 193 can be applied.

SUMMARY

The embodiments overcome at least some of the disadvantages mentioned above.

The embodiments achieve an improved method to partition a via structure by using two plating resist layers in the PCB separated by at least one dielectric layer as to produce an electrically isolating portion of the via structure between two electrically conducting portions of said via structure.

One advantage of using the improved method is that only one drilling operation is needed when drilling the holes for the via. There is no need for high tolerance back drilling or sequential laminations with separate drilling for each sequential configuration.

Another advantage is that using two (or more) plating resist layers an arbitrary size of the conductive portions and the isolating/non-conductive portions of the via can be created allowing for more flexible circuit design.

The method allows to create non-conductive portions of different sizes in the via using the same type and thickness of the plating resist layers. This has the additional advantage of simplifying the manufacturing process and there is no need to keep plating resist layers with different thickness in stock.

The invention embodiments will now be described in more detail and with preferred embodiments and referring to accompanying drawings.

BRIEF DESCRIPTION OF THE DRAWINGS

FIGS. 2A, 2B and 3 are block diagrams illustrating a PCB and the method steps for producing an improved via structure within said PCB.

DETAILED DESCRIPTION

An embodiment of a method for producing an improved via structure is illustrated in FIGS. 2A, 2B, 3 and 6. FIG. 2A illustrates four steps of the method applied on one and the same PCB 200. The PCB 200 has a plurality of conductive layers (normally copper layers) 201-208 and sandwiched between the copper layers 201-208 are dielectric layers as prepreg layers 211-214 and laminate layers 221-223 respectively. Prepreg which is an abbreviation for pre-impregnated is a fiber weave impregnated with a resin bonding agent.

Figure 6:
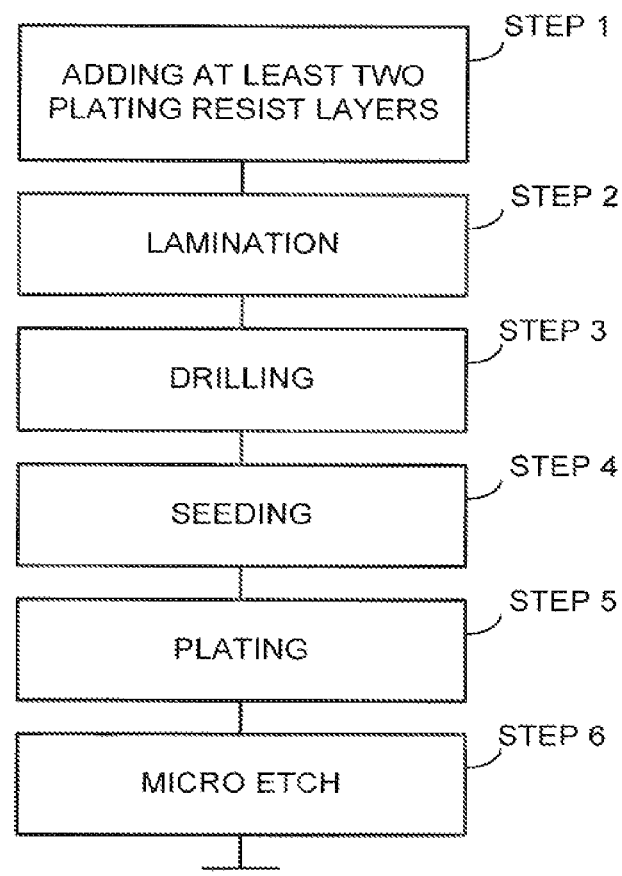
FIG. 6 is a flow chart illustrating the method steps for producing the improved via structures.

Before lamination, islands of at least two plating resist layers 231-234 are added at predetermined places on the copper layers 203-206 on the laminates 221-223 in step 1 (as shown in FIG. 6).

Figures 1A, 1B:
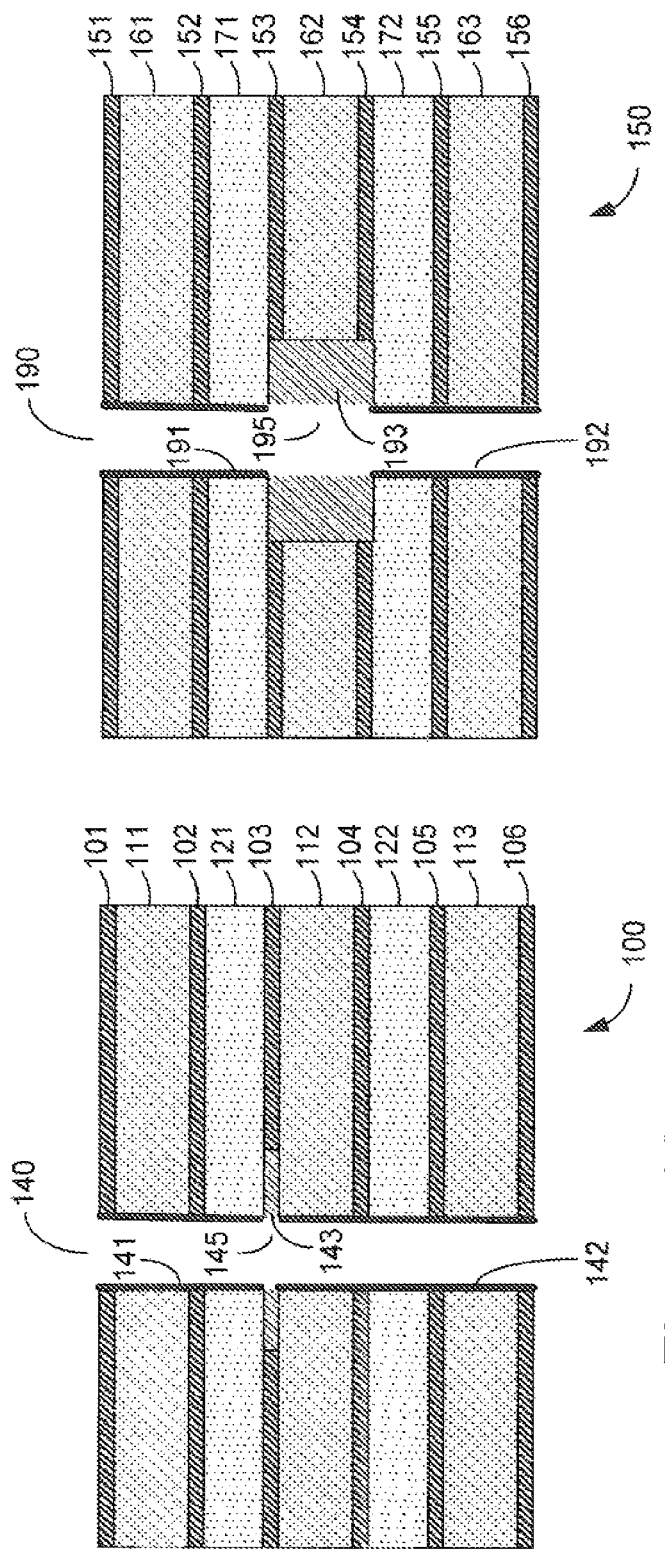
FIGS. 1A and 1B are block diagrams illustrating partitioned via structures.
Figure 3:
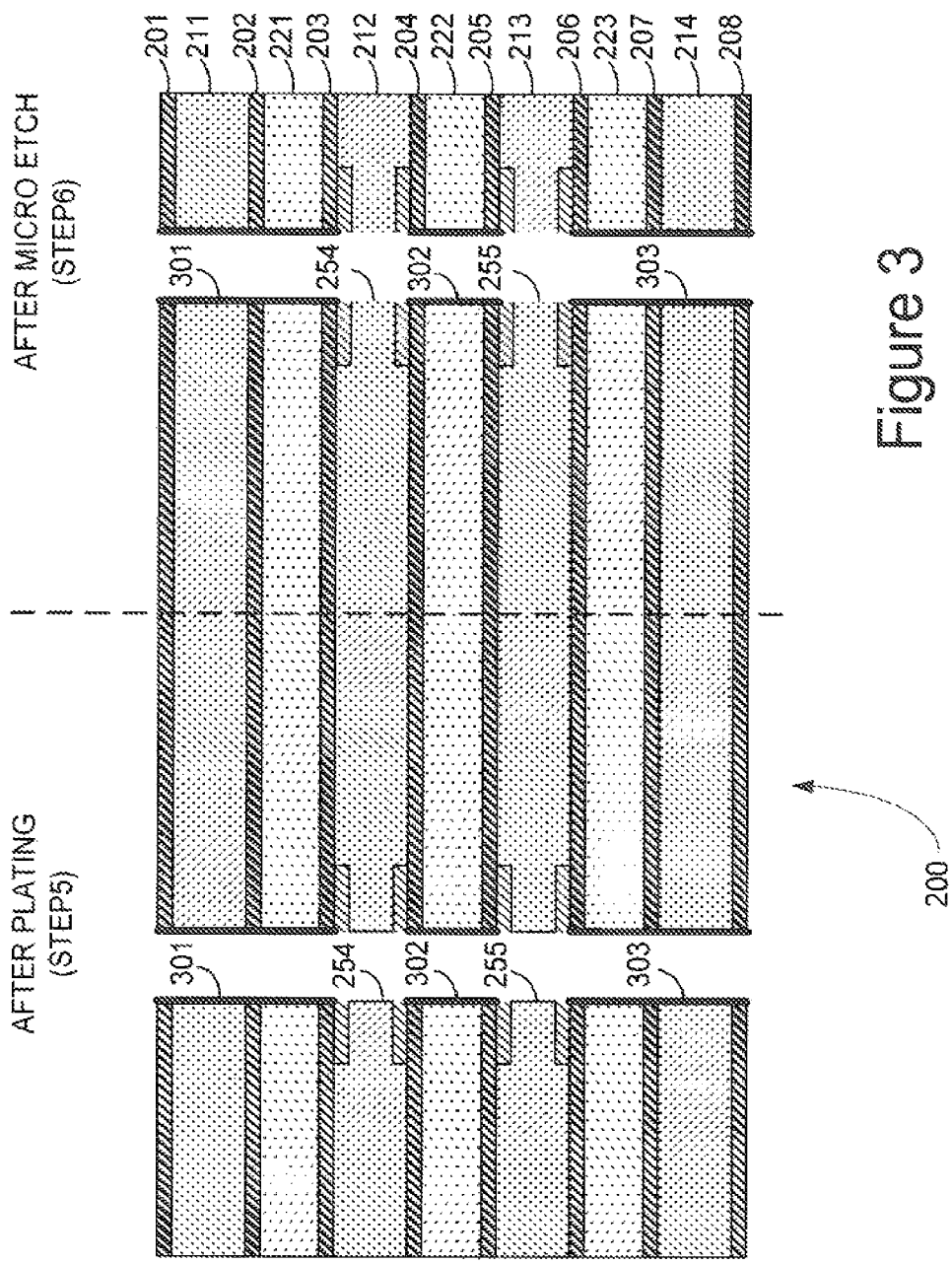

The plating resist layer can also be added directly on the laminate (not shown in FIG. 2A). In the lamination process, the islands of the plating resist layers are embedded in the prepreg layers 212 and 213 as seen in step 2 (as shown in FIG. 6). In step 3 (as shown in FIG. 6) a through hole 240 is drilled in the PCB 200 through the copper layers 201-208 and the plating resist layers 231-234. In step 4 (as shown in FIG. 6) and before plating, a thin layer 251 of chemical copper, is added to the inside of through hole 240 by placing the PCB 200 in a seed catalyzing bath. This thin layer 251 adheres to all inner parts of the through hole 240 except for the plating resist layers 231-234 as seen in positions 252 and 253 in FIG. 2B. In step 5 (as shown in FIGS. 3 and 6) the PCB is placed in an electrolytic copper plating bath. As the portion 254 of the thin layer 251 of chemical copper located between the two plating resist layers 231 and 232 and the portion 255 located between the two plating resist layers 233 and 234 are electrically isolated from the other conductive layers no copper is plated on these portions during the electrolytic plating process. After copper plating of the through hole 240, the thin copper layer that remains on portions 254 and 255 is removed by using micro etch (or an equivalent post processing operation). The resulting via structure is seen in step 6 (as shown in FIG. 6) with three conductive portions 301-303 and two non-conductive portions 254 and 255 where the non-conductive portions 254 and 255 have a significant larger isolation distance than when using one thin plating resist layer only.

Figure 4:
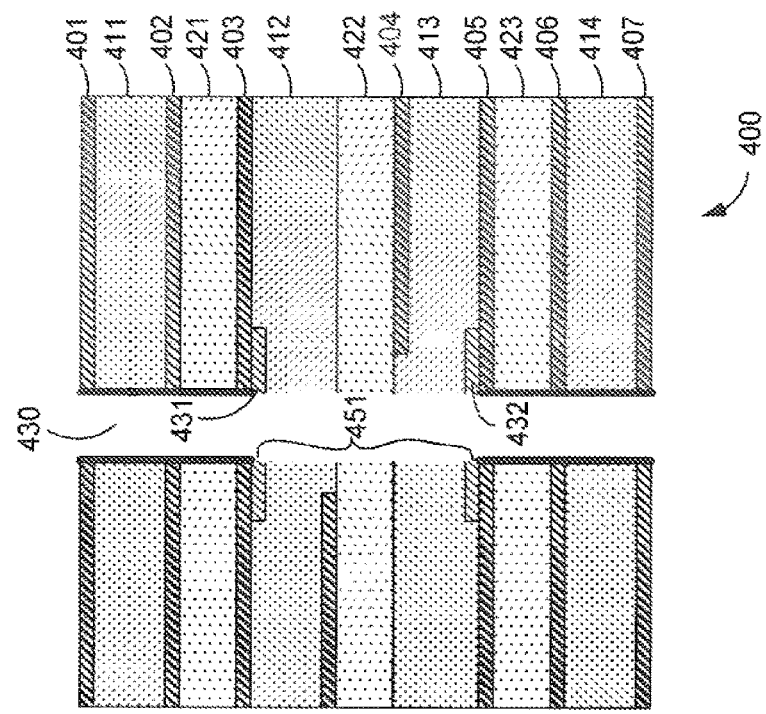

In the embodiment illustrated in FIGS. 2A, 2B and 3 the plating resist layers 231 and 232 are embedded in the same prepreg layer 212. The improved method is not limited to this configuration. FIG. 4 illustrates an embodiment of a PCB 400 having a plurality of copper layers 401-407 and dielectric layers 411-413 and 421-423. In the PCB 400 the plating resist layers 431 and 432 are embedded in different prepreg layers 412 and 413 apart from each other and where the non-conductive portion 451 becomes larger.

Figure 5:
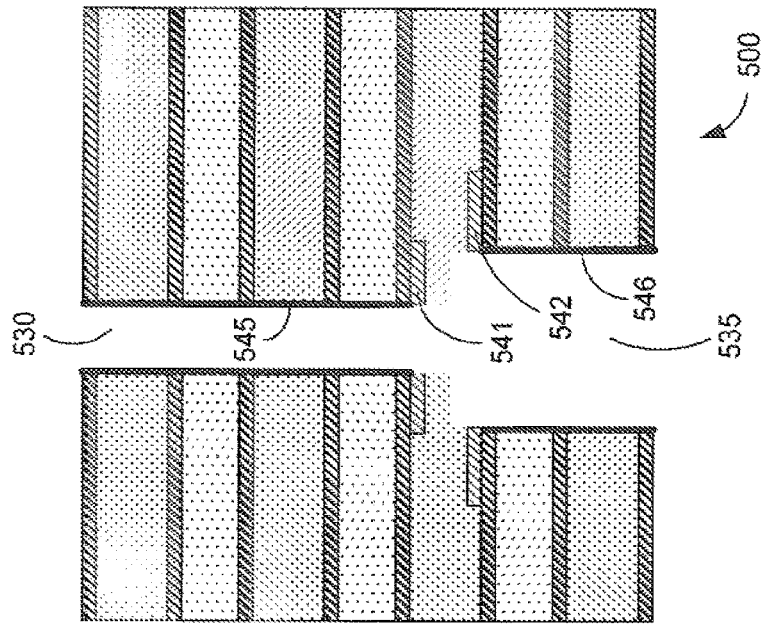
FIGS. 4 and 5 are block diagrams illustrating other embodiments of improved via structures.

The improved method is not limited to producing through hole vias only but can also be applied to blind vias or vias with different diameters within the same via structure. An example of the latter is illustrated in FIG. 5. In FIG. 5, a via structure in a PCB 500 is divided into two via portions 530, 535 with different diameters. The narrower via portion 530 is electrically isolated from the broader via portion 535 by using two plating resist layers 541,542 in the same manner as described above. The broader via portion 535 is produced by an additional step of back drilling with a larger drill before the seed catalyzing bath in step 4. The resulting plated portion 546 of the broader via portion 535 can for example be used for mounting components to the PCB 500. As the plated portion 545 of the narrower via portion 530 is isolated from the plated portion 546 of the broader via portion 535 it can be used for conducting current between other conductive layers in the PCB 500.

The embodiments can be implemented in an apparatus that further includes at least one microprocessor, a computer-readable medium including computer-readable instructions, when executed by the at least one microprocessor, are configured to control fabrication equipment to perform the methods described herein. Embodiments can also be implemented in digital electronic circuitry, in computer hardware, firmware, software, or in combinations thereof. Storage device suitable for embodying the computer program instructions include signals capable of programming a data processing system, all forms of non-volatile memory including, but not limited to: semiconductor memory devices such as EPROM, EEPROM, and flash devices; magnetic disks (fixed, floppy, and removable); other magnetic media such as tape; optical media such as CD-ROM, DVD-ROM, and Blu-ray disks; and magneto-optic devices. Any of the foregoing may be supplemented by, or incorporated in, specially-designed application-specific integrated circuits (ASIC) or suitably programmed field programmable gate arrays (FPGAs).

What is claimed is:

1. An apparatus for partitioning a via in a multilayer printed circuit board to produce an electrically isolating portion between two electrically conducting portions in said via, the apparatus comprising:
   a non-transitory computer-readable storage medium having stored therein a fabrication controller; and
   a set of one or more processors, the processors to execute to the fabrication controller, which when executed by the set of one or more processors, cause fabrication equipment to place at least one island of a first plating resist layer on a first layered structure including a first conductive layer and a first dielectric layer, to place at least one island of a second plating resist layer on a second layered structure including a second conductive layer and a second dielectric layer, to laminate the first and second layered structures with a third intermediate layered structure including at least one third dielectric layer adapted so that the islands of the first plating resist layer and the second plating resist layer become embedded in the at least one third dielectric layer, to drill a first hole in the printed circuit board so that the first hole passes through the islands of the first plating resist layer and the second plating resist layer, to process in a first step the printed circuit board so that copper is placed on an interior of the first hole except for portions with the first plating resist layer and the second plating resist layer, to process in a second step the printed circuit board so that additional copper is placed on the interior of the first hole except for portions of the first plating resist layer and the second plating resist layer and except for portion of the at least one third dielectric layer, and to process in a third step the printed circuit board so that the copper placed on an at least one third dielectric layer portion of the first hole is removed.

2. The apparatus of claim 1, wherein the third step of removing copper from the at least one third dielectric layer portion of the first hole is done by microetching.

3. The apparatus of claim 1, wherein the at least one third dielectric layer is made of an impregnated fiber weave adapted to embed the islands of the first plating resist layer and the second plating resist layer.

4. The apparatus of claim 3, wherein the fiber weave is impregnated with a resin bonding agent.

5. The apparatus of claim 1, wherein the first hole is partly penetrating the printed circuit board.

6. The apparatus of claim 1, wherein the first hole is a through hole through the printed circuit board.

7. The apparatus of claim 1, wherein drilling the first hole includes drilling with a larger drill from an opposite side of the printed circuit board as to produce two portions of the via with different diameters and wherein the two portions of the via meet each other in a position between the first plating resist layer and the second plating resist layer.

8. The apparatus of claim 1, wherein the first step is a copper seed catalyzing bath, and wherein the second step is an electrolytic copper plating bath where the copper placed on the at least one third dielectric layer portion of the first hole is electrically isolated from the first and second conductive layers.

9. The apparatus of claim 1, wherein the first hole passes through the first conductive layer and the second conductive layer.

10. The apparatus of claim 1, wherein the first layered structure includes a third conductive layer and a third dielectric layer that is covered by the laminating.

11. A non-transitory computer-readable storage medium having stored therein a set of instructions, which when executed by one or more microprocessors cause fabrication equipment to perform a set of operations, the set of operations comprising:
    placing at least one island of a first plating resist layer on a first layered structure including a first conductive layer and a first dielectric layer, to place at least one island of a second plating resist layer on a second layered structure including a second conductive layer and a second dielectric layer, to laminate the first and second layered structures with a third intermediate layered structure including at least one third dielectric layer adapted so that the islands of the first plating resist layer and the second plating resist layer become embedded in the at least one third dielectric layer, to drill a first hole in a printed circuit board so that the first hole passes through the islands of the first plating resist layer and the second plating resist layer, to process in a first step the printed circuit board so that copper is placed on an interior of the first hole except for portions with the first plating resist layer and second plating resist layer, to process in a second step the printed circuit board so that additional copper is placed on the interior of the first hole except for portions of the first plating resist layer and the second plating resist layer and except for portion of the at least one third dielectric layer, and to process in a third step the printed circuit board so that the copper placed on an at least one third dielectric layer portion of the first hole is removed.

12. The non-transitory computer-readable medium of claim 11, wherein the third step of removing copper from the at least one third dielectric layer portion of the first hole is done by microetching.

13. The non-transitory computer-readable medium of claim 11, wherein the at least one third dielectric layer is made of an impregnated fiber weave adapted to embed the islands of the first plating resist layer and the second plating resist layer.

14. The non-transitory computer-readable medium of claim 13, wherein the fiber weave is impregnated with a resin bonding agent.

15. The non-transitory computer-readable medium of claim 11, wherein the first hole is partly penetrating the printed circuit board.

16. The non-transitory computer-readable medium of claim 11, wherein the first hole is a through hole through the printed circuit board.

17. The non-transitory computer-readable medium of claim 11, wherein drilling the first hole includes drilling with a larger drill from an opposite side of the printed circuit board as to produce two portions of the via with different diameters and wherein the two portions of the via meet each other in a position between the first plating resist layer and the second plating resist layer.

18. The non-transitory computer-readable medium of claim 11, wherein the first step is a copper seed catalyzing bath, and wherein the second step is an electrolytic copper plating bath where the copper placed on the at least one third dielectric layer portion of the first hole is electrically isolated from the first and second conductive layers.

19. The non-transitory computer-readable medium of claim 11, wherein the first hole passes through the first conductive layer and the second conductive layer.

20. The non-transitory computer-readable medium of claim 11, wherein the first layered structure includes a third conductive layer and a third dielectric layer that is covered by the laminating.

* * * * *

UNITED STATES PATENT AND TRADEMARK OFFICE
CERTIFICATE OF CORRECTION

PATENT NO. : 10,201,098 B2
APPLICATION NO. : 16/019452
DATED : February 5, 2019
INVENTOR(S) : Kallman et al.

Page 1 of 1

It is certified that error appears in the above-identified patent and that said Letters Patent is hereby corrected as shown below:

In the Specification

In Column 1, Line 9, delete "14/387,928," and insert -- 14/387,928, now Pat. No. 10,034,391, --, therefor.

Signed and Sealed this
Tenth Day of September, 2019

Andrei Iancu
*Director of the United States Patent and Trademark Office*